(12) United States Patent
Faue

(10) Patent No.: US 7,091,746 B2
(45) Date of Patent: Aug. 15, 2006

(54) REDUCED DEVICE COUNT LEVEL SHIFTER WITH POWER SAVINGS

(75) Inventor: Jon Allan Faue, Colorado Springs, CO (US)

(73) Assignee: ProMOS Technologies Inc., Hsinchu (TW)

( * ) Notice: Subject to any disclaimer, the term of this patent is extended or adjusted under 35 U.S.C. 154(b) by 121 days.

(21) Appl. No.: 10/960,369

(22) Filed: Oct. 7, 2004

(65) Prior Publication Data

US 2006/0076975 A1    Apr. 13, 2006

(51) Int. Cl.
*H03K 19/094*    (2006.01)
*H03K 19/0175*   (2006.01)

(52) U.S. Cl. ......................................... 326/68; 326/83
(58) Field of Classification Search .................. 326/68, 326/63, 81–83, 26–27
See application file for complete search history.

(56) References Cited

U.S. PATENT DOCUMENTS

| | | | | |
|---|---|---|---|---|
| 5,777,497 A | * | 7/1998 | Han | ............................ 327/108 |
| 5,896,043 A | * | 4/1999 | Kumagai | ........................ 326/68 |
| 5,917,348 A | * | 6/1999 | Chow | ........................... 327/108 |
| 6,531,900 B1 | * | 3/2003 | Hardee | ......................... 327/108 |
| 6,717,452 B1 | * | 4/2004 | Carpenter et al. | ............ 327/333 |
| 6,777,981 B1 | * | 8/2004 | Kobayashi | .................... 326/81 |

\* cited by examiner

*Primary Examiner*—Rexford Barnie
*Assistant Examiner*—Jason Crawford
(74) *Attorney, Agent, or Firm*—Peter J. Meza; William J. Kubida; Hogan & Hartson LLP

(57) ABSTRACT

A level shifting circuit includes an input node, an output node, a first power supply node, a second power supply node, a third power supply node, an inverter coupled to the first and second power supply nodes having an input coupled to the input node and an output, a transistor having a current path coupled between the output of the inverter an the output node, a first transistor circuit coupled between the first power supply node and the third power supply node having a first input coupled to the output of the inverter, a second input coupled to the output node, and an output, and a second transistor circuit coupled between the output node and the third power supply node having a first input coupled to the output of the first transistor circuit and a second input coupled to the input node.

24 Claims, 3 Drawing Sheets

US 7,091,746 B2

REDUCED DEVICE COUNT LEVEL SHIFTER WITH POWER SAVINGS

BACKGROUND OF THE INVENTION

The present invention relates, in general, to the field of integrated circuits. More particularly, the present invention relates to a circuit resident on an integrated circuit for the level shifting of voltages between at least one pumped supply.

Level shifting circuits are known in the art. While there are many different level shifting circuits to choose from, most such circuits use too many devices and undesirably occupy too much precious area on the integrated circuit. Further, larger circuits consume too much power. Increased chip area and power consumption lead to higher operating and chip costs.

What is desired is a reduced device count level shifting circuit in which both the number of devices in the circuit and the corresponding power consumption is reduced as much as possible.

SUMMARY OF THE INVENTION

In accordance with an embodiment of the present invention, a level shifting circuit accomplishes the desired level shifting function, while still saving power when compared to prior art designs. The level shifting circuit of the present invention uses fewer devices when compared to prior art designs, thereby allowing it to be used in smaller spaces on the chip.

By restricting the range of difference between two critical power supplies to less than a threshold device of a single transistor, just this one single device can be used to isolate the two discharge paths of the node in question. This single device is biased in such a way that during the critical off period it is in a "body-effected" condition, thereby raising its relative threshold voltage ($V_T$).

When switching commences in the critical direction, the initial discharge current goes into a first supply voltage, which is not the pumped supply. Eventually, in direct response to the node being discharged to the first supply, a second discharge path is enabled which completes the transition of the output node to the level of the second supply.

No special considerations for power or level shifting when the circuit switches in the opposite direction are required since the circuit is not switching to a pumped supply.

According to an embodiment of the present invention, a level shifting circuit includes an input node, an output node, a first power supply node (VINT), a second power supply node (VSS), a third power supply node (VNWL in a first embodiment of the invention and VXX in a second embodiment of the invention), an inverter coupled between the first and second power supply nodes having an input coupled to the input node and an output, a transistor having a current path coupled between the output of the inverter and the output node, a first transistor circuit coupled between the first power supply node and the third power supply node having a first input coupled to the output of the inverter, a second input coupled to the output node, and an output, and a second transistor circuit coupled between the output node and the third power supply node having a first input coupled to the output of the first transistor circuit and a second input coupled to the input node.

The inverter includes a P-channel transistor coupled to the first power supply node, coupled to an N-channel transistor coupled to the second power supply node. The first transistor circuit includes a P-channel transistor having a source coupled to the first power supply node, a gate coupled to the output of the inverter, and a drain, a first N-channel transistor having a drain coupled to the drain of the P-channel transistor, a gate coupled to the output of the inverter, and a source, and a second N-channel transistor having a drain coupled to the source of the first N-channel transistor, a gate coupled to the output node, and a source coupled to the third power supply node. The second transistor circuit includes a first N-channel transistor having a drain coupled to the output node, a gate coupled to the output of the first transistor circuit, and a source, and a second N-channel transistor having a drain coupled to the source of the first N-channel transistor, a gate coupled to the input node, and a source coupled to the third power supply node.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
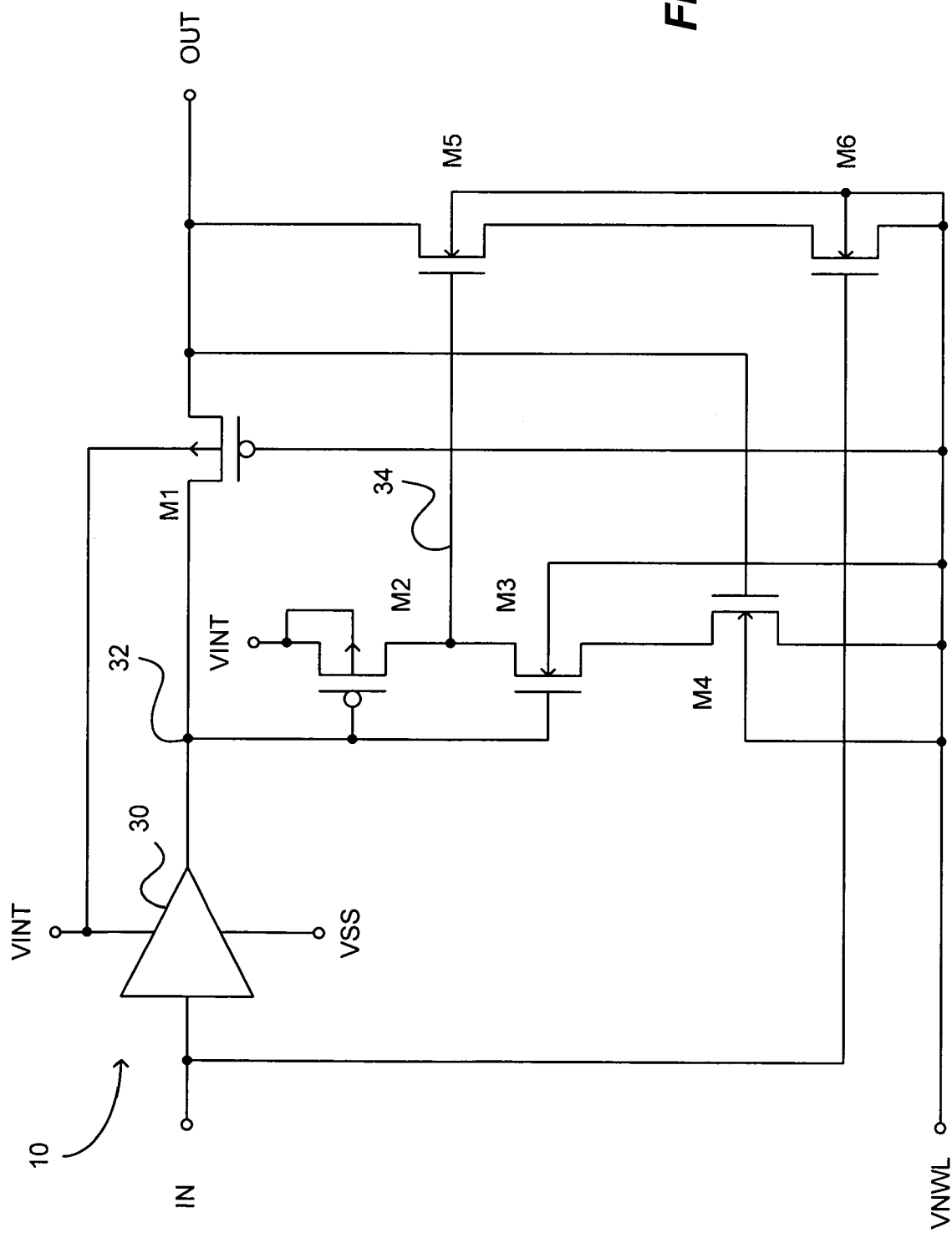
FIG. 1 is a schematic diagram of a first embodiment of a level-shifting circuit according to the present invention.
Figure 2:
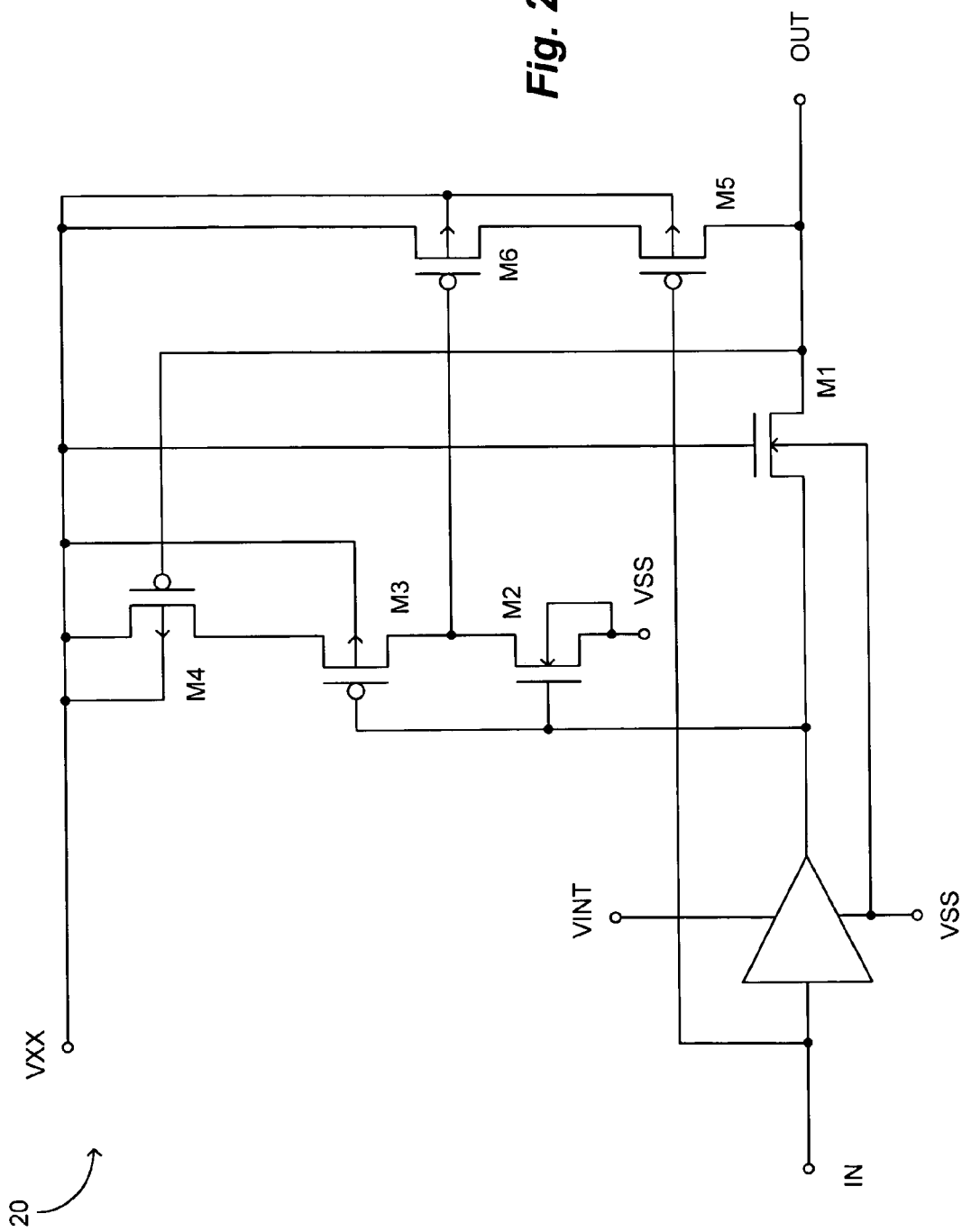
FIG. 2 is a schematic diagram of a second embodiment of a level-shifting circuit according to the present invention.

Referring generally to FIGS. 1 and 2, an input voltage switching between a first set of voltage levels is level-shifted to provide an output voltage that switches between a second set of voltage levels. The "IN" input node switches between a "VPP" pumped voltage supply level and a "VSS" voltage supply level. VPP is nominally pumped to 2.8 volts on the chip, and VSS is nominally zero volts. The VPP power supply voltage is not shown in FIGS. 1 or 2. The "OUT" output node is the level-shifted voltage, and it switches between the "VINT" and "VNWL" voltage supply levels. VINT is nominally 1.8 volts, and VNWL is nominally −0.3 volts. In the embodiments shown in FIGS. 1 and 2, VPP>VINT and VSS>VNWL. No special considerations for VPP to VINT level shifting are needed. In other words, the input signal "IN" could easily be a VINT−VSS signal. If VPP−VSS is greater than or equal to VINT−VSS, then no level shifting is required.

Figure 3:
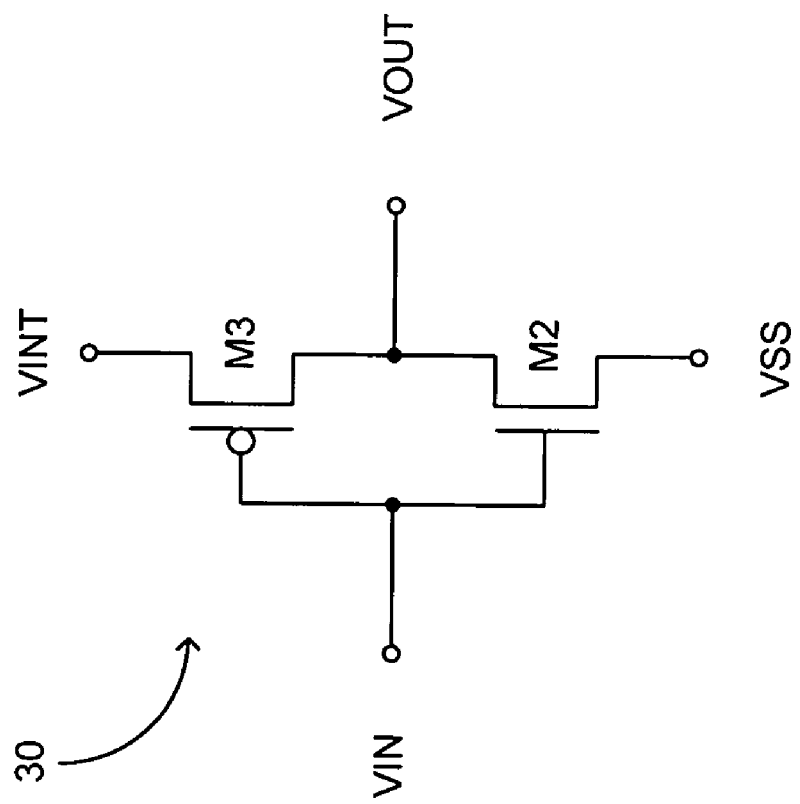
FIG. 3 is a schematic diagram of a prior art inverter circuit suitable for use in the circuits of either FIG. 1 or FIG. 2.

As previously discussed, the "OUT" output node switches between VINT and VNWL. Intermediate node 32 switches between VINT and VSS and is isolated from the OUT output node by a single P-channel device, M1. VINT is nominally 1.8 volts, VSS is nominally zero volts, and VNWL is nominally −0.3 volts. Initially, in the standby state, IN is equal to zero volts. Referring temporarily to FIG. 3, device M3 is on and M2 is off, and thus the output of the inverter (node 32) is equal to VINT. The gate of M1 is tied to the VNWL power supply, and since node 32 is the source node, the VGS of M1 is equal to VNWL−VINT. Therefore, M1 is on and the output voltage OUT is equal to the voltage at node 32, which is equal to VINT. If node 32 is equal to VINT, then M2 is off, M3 is on, and M4 is on as well. Since the VGS of device M4 is equal to OUT−VNWL, node 34 is pulled to VNWL through the M3/M4 devices. This ensures that device M5 is off. The VGS of device M5 is equal to zero volts, VNWL−VNWL. Device M6 may not be completely off since its VGS is equal to zero volts minus VNWL, which is slightly positive. However, there is no current in the M5/M6 path since device M5 is off.

When the IN input node switches high, the P-channel device within the inverter 30 turns off and the N-channel device within the inverter turns on, switching node 32 through the N-channel device directly to VSS. As long as device M1 remains on, the OUT output node is also discharged to VSS. When the OUT output node has discharged to within a $V_T$ of VNWL, then device M1 turns off and the output node cannot be discharged any further to VSS. Note that VSS is not a pumped supply, whereas VNWL is a pumped supply. It is therefore desirable to minimize the current flow in the VNWL path. Since node 32 switches to the VSS level, device M2 turns on and node 34 switches to the VINT supply level. Device M3 is not completely off since its VGS is equal to zero volts minus VNWL. However, device M3 should be off sufficiently such that node 34 is at the VINT level. With the input node and node 34 both high, devices M5 and M6 are both on. The OUT output node finishes the switching operation by discharging to VNWL. With the output node at its final low level of VNWL, device M4 is completely off and there is no possible current path through the M3/M4 devices.

In this state node 32 is equal to VSS, but OUT=VNWL. However, there is no current flow through device M1 from VSS to VNWL, since that device is off. The gate of device is at the VNWL level, so VGS is equal to VNWL−VSS. This voltage difference should be less than the threshold voltage, $V_T$, of the M1 device. Since the body of the M1 device is at the VINT level, the M1 $V_T$ in this condition is even larger (more negative).

In the circuit embodiment shown in FIG. 1 the body connection of devices M1 and M2 are coupled to VINT, whereas the body connection of devices M3, M4, M5, and M6 are coupled to VNWL.

The circuit 10 of FIG. 1 has been described wherein devices M1 and M2 are P-channel devices, and devices M3, M4, M5, and M6 are N-channel devices.

Referring now to FIG. 2, a second embodiment of a level-shifting circuit 20 according to the present invention is shown having an "opposite" configuration, in which the N-channel devices are replaced by P-channel devices, and vice-versa. While the configuration and operation of the level-shifting circuit 20 are very similar to that of the circuit 10 shown in FIG. 1, there are some differences. Note in particular that the sources of transistors M4 and M6 are coupled to the VXX power supply node, which receives a pumped power supply voltage VXX, which is greater than (more positive than) VINT.

In the circuit embodiment shown in FIG. 2 the body connection of device M1 is coupled to VSS, whereas the body connection of devices M2, M3, M4, M5, and M6 are coupled to VXX.

While there have been described above the principles of the present invention in conjunction with specific components, circuitry and bias techniques, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

I claim:

1. A level shifting circuit comprising:
   an input node;
   an output node;
   a first power supply node;
   a second power supply node;
   a third power supply node;
   an inverter coupled between the first and second power supply nodes having an input coupled to the input node and an output;
   a transistor having a current path coupled between the output of the inverter an the output node;
   a first transistor circuit coupled between the first power supply node and the third power supply node having a first input coupled to the output of the inverter, a second input coupled to the output node, and an output;
   a second transistor circuit coupled between the output node and the third power supply node having a first input coupled to the output of the first transistor circuit and a second input coupled to the input node.

2. The level shifting circuit of claim 1 in which the inverter comprises a P-channel transistor coupled to the first power supply node, coupled to an N-channel transistor coupled to the second power supply node.

3. The level shifting circuit of claim 1 in which the first transistor circuit comprises:
   a P-channel transistor having a source coupled to the first power supply node, a gate coupled to the output of the inverter, and a drain;
   a first N-channel transistor having a drain coupled to the drain of the P-channel transistor, a gate coupled to the output of the inverter, and a source; and
   a second N-channel transistor having a drain coupled to the source of the first N-channel transistor, a gate coupled to the output node, and a source coupled to the third power supply node.

4. The level shifting circuit of claim 1 in which the second transistor circuit comprises:
   a first N-channel transistor having a drain coupled to the output node, a gate coupled to the output of the first transistor circuit, and a source; and
   a second N-channel transistor having a drain coupled to the source of the first N-channel transistor, a gate coupled to the input node, and a source coupled to the third power supply node.

5. The level shifting circuit of claim 1 in which an input voltage on the input node is greater than a power supply voltage on the first power supply node.

6. The level shifting circuit of claim 1 in which a power supply voltage on the second power supply node is less than an input voltage on the input node.

7. The level shifting circuit of claim 1 in which the first transistor circuit comprises:
- an N-channel transistor having a source coupled to the second power supply node, a gate coupled to the output of the inverter, and a drain;
- a first P-channel transistor having a drain coupled to the source of the N-channel transistor, a gate coupled to the output of the inverter, and a source; and
- a second P-channel transistor having a drain coupled to the source of the first P-channel transistor, a gate coupled to the output node, and a source coupled to the third power supply node.

8. The level shifting circuit of claim 1 in which the second transistor circuit comprises:
- a first P-channel transistor having a drain coupled to the output node, a gate coupled to the input node, and a source; and
- a second P-channel transistor having a drain coupled to the source of the first P-channel transistor, a gate coupled to the output of the first transistor circuit, and a source coupled to the third power supply node.

9. The level shifting circuit of claim 1 in which the transistor comprises a P-channel transistor.

10. The level shifting circuit of claim 1 in which the transistor comprises an N-channel transistor.

11. A level shifting circuit comprising:
- an input node;
- an output node;
- a first power supply node;
- a second power supply node;
- a third power supply node;
- an inverter coupled between the first and second power supply nodes having an input coupled to the input node and an output;
- a first transistor having a current path coupled between the output of the inverter an the output node;
- a second transistor having a source coupled to the first power supply node, a gate coupled to the output of the inverter, and a drain;
- a third transistor having a drain coupled to the drain of the second transistor, a gate coupled to the output of the inverter, and a source;
- a fourth transistor having a drain coupled to the source of the third transistor, a gate coupled to the output node, and a source coupled to the third power supply node;
- a fifth transistor having a drain coupled to the output node, a gate coupled to the drains of the second and third transistors, and a source; and
- a sixth transistor having a drain coupled to the source of the fifth transistor, a gate coupled to the input node, and a source coupled to the third power supply node.

12. The level shifting circuit of claim 11 in which the inverter comprises serially-coupled N-channel and P-channel transistors.

13. The level shifting circuit of claim 11 in which the first and second transistors each comprise a P-channel transistor.

14. The level shifting circuit of claim 11 in which the third and fourth transistors each comprise an N-channel transistor.

15. The level shifting circuit of claim 11 in which the fifth and sixth transistors each comprise an N-channel transistor.

16. A level shifting circuit comprising:
- an input node;
- an output node;
- a first power supply node;
- a second power supply node;
- a third power supply node;
- an inverter coupled between the first and second power supply nodes having an input coupled to the input node and an output;
- a first transistor having a current path coupled between the output of the inverter an the output node;
- a second transistor having a source coupled to the second power supply node, a gate coupled to the output of the inverter, and a drain;
- a third transistor having a drain coupled to the drain of the second transistor, a gate coupled to the output of the inverter, and a source;
- a fourth transistor having a drain coupled to the source of the third transistor, a gate coupled to the output node, and a source coupled to the third power supply node;
- a fifth transistor having a drain coupled to the output node, a gate coupled to the input node, and a source; and
- a sixth transistor having a drain coupled to the source of the fifth transistor, a gate coupled to the drains of the second and third transistors, and a source coupled to the third power supply node.

17. The level shifting circuit of claim 16 in which the inverter comprises serially-coupled N-channel and P-channel transistors.

18. The level shifting circuit of claim 16 in which the first and second transistors each comprise an N-channel transistor.

19. The level shifting circuit of claim 16 in which the third and fourth transistors each comprise a P-channel transistor.

20. The level shifting circuit of claim 16 in which the fifth and sixth transistors each comprise a P-channel transistor.

21. The level shifting circuit of claim 11 in which a body connection of the first and second transistors is coupled to the first power supply node.

22. The level shifting circuit of claim 11 in which a body connection of the third, fourth, fifth, and sixth transistors is coupled to the third power supply node.

23. The level shifting circuit of claim 16 in which a body connection of the first transistor is coupled to the second power supply node.

24. The level shifting circuit of claim 16 in which a body connection of the second, third, fourth, fifth, and sixth transistors is coupled to the third power supply node.

* * * * *